(12) United States Patent
Miyazawa

(10) Patent No.: US 8,928,373 B2
(45) Date of Patent: Jan. 6, 2015

(54) SEMICONDUCTOR DEVICE

(71) Applicant: Fuji Electric Co., Ltd., Kawasaki-shi (JP)

(72) Inventor: Shigemi Miyazawa, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/804,289

(22) Filed: Mar. 14, 2013

(65) Prior Publication Data

US 2013/0241609 A1   Sep. 19, 2013

(30) Foreign Application Priority Data

Mar. 16, 2012  (JP) .................... 2012-059668

(51) Int. Cl.
*H03L 7/00* (2006.01)
*H03K 3/57* (2006.01)
*F02P 3/055* (2006.01)
*F02P 9/00* (2006.01)

(52) U.S. Cl.
CPC ............... *H03K 3/57* (2013.01); *F02P 3/0554* (2013.01); *F02P 9/005* (2013.01)
USPC ............................. 327/143; 327/142; 327/198

(58) Field of Classification Search
USPC .......................... 327/142, 143, 198, 365–508
See application file for complete search history.

(56) References Cited

U.S. PATENT DOCUMENTS

2006/0022609 A1   2/2006   Yukutake et al.

FOREIGN PATENT DOCUMENTS

| JP | 2001-153012 A | 6/2001 |
| JP | 2002-371945 A | 12/2002 |
| JP | 2006-037822 A | 2/2006 |
| JP | 2008-045514 A | 2/2008 |

*Primary Examiner* — Brandon S Cole
(74) *Attorney, Agent, or Firm* — Rossi, Kimms & McDowell LLP

(57) ABSTRACT

A semiconductor device for ignition performing a current control function and a self shut down function can include a pulse generating circuit, a switching circuit, and a current source circuit, the three circuits together generating a pulse current that discharges a capacitor in the self shut down process. This construction can serve to suppress oscillation of a collector current Ic of the output stage IGBT in the operating processes of the current control circuit and the self shut down circuit, thus preventing or minimizing the likelihood of the ignition plug from erroneous ignition. In addition, the discharge of the capacitor in a pulsed mode can allow for downsizing of the capacitor, which can contribute to minimization of the semiconductor device.

4 Claims, 14 Drawing Sheets

SEMICONDUCTOR DEVICE

BACKGROUND OF THE INVENTION

1. Field of the Invention

Embodiments of the invention relate to semiconductor devices for use in ignition devices for, for example, internal combustion engines.

2. Description of the Related Art

An ignition device for an internal combustion engine of a vehicle uses a semiconductor device installing a power semiconductor element for switching control of a primary current in an ignition coil. FIG. 12 shows an example of construction of a conventional, general semiconductor device for ignition of an internal combustion engine using a power semiconductor element of an insulated gate bipolar transistor (IGBT).

The semiconductor device for ignition shown in FIG. 12 includes an engine control unit (ECU) 501, which is an electronic control unit, a semiconductor integrated circuit (IC) for ignition (an ignition IC) 502, an ignition coil 503, a voltage source 504, and an ignition plug 505.

The ignition IC 502 includes an output stage IGBT 511 for ON/OFF controlling the primary current of the ignition coil 503, a sensing IGBT 512 having a common collector and a common gate with the output stage IGBT 511 and detecting sense current, a sensing resistor 513, a gate resistor 514, and a current control circuit 510 for controlling the collector current of the output stage IGBT 511. The ignition IC 502 has three terminals of a collector (C) terminal connecting to the ignition coil 503, an emitter (E) terminal connecting to the ground potential, and a gate (G) terminal connecting to the ECU 501.

Operation of the semiconductor device for ignition shown in FIG. 12 is described in the following. The ECU 501 delivers a signal for ON/OFF controlling the output stage IGBT 511 in the ignition IC 502 to the G terminal. When a signal at 5 V is given to the G terminal, the output IGBT 511 turns ON, and when a signal at 0 (zero) volts is given to the G terminal, the output stage IGBT 511 turns OFF.

Receiving an ON signal at the G terminal from the ECU 501, the output stage IGBT 511 of the ignition IC 502 turns ON and collector current Ic begins to flow from the voltage source 504 of 14 V, for example, through the primary coil 506 of the ignition coil 503, to the C terminal of the ignition IC 502. The Ic increases at a rate dI/dt that is determined by the inductance of the primary coil 506 and the applied voltage up to a current value, 13 A for example, controlled by the current control circuit 510 and remains at this current value.

Then, when an OFF signal is given from the ECU 501 to the G terminal, the output stage IGBT 511 of the ignition IC 502 turns OFF, decreasing the Ic rapidly. The rapid change of the Ic increases abruptly the voltage across the primary coil 506. At the same time, the voltage across the secondary coil 507 also rises to several tens of kilo volts, for example 30 kV. This high voltage is applied to the ignition plug 505, which discharges at voltages higher than about 10 kV.

In the case the ignition coil 503 or the ignition IC 502 might be damaged by overheating due to excessively long period of output of the ON signal from the ECU 1 or extraordinarily high temperature of the ignition IC 502, the Ic is shut down by operation of a self shut down circuit 533 installed in the current control circuit 510. However, abrupt shut down of the Ic may cause discharges of the ignition plug 505 at an unintended timing and damage to the engine. Accordingly, the Ic needs to be decreased at a dI/dt within a rate that does not cause erroneous discharge of the ignition plug 505.

FIG. 13 shows an example of construction of the current control circuit 510. This control circuit 510 is driven by a voltage between the G terminal and the E terminal, and includes a reference voltage circuit 531, a level shift circuits 532 and 534, a self shut down circuit 533, a comparator 535, and a metal oxide semiconductor field effect transistor (MOSFET) 536.

The reference voltage circuit 531 outputs a reference voltage Vref dividing, with a resistor 813 and a resistor 814, the voltage that is generated with a bias circuit composed of a depletion MOSFET (DepMOSFET) 811 and a MOSFET 812 that are connected in series and have a common gate terminal.

The level shift circuit 532 comprises: a bias circuit composed of a DepMOSFET 821 and a MOSFET 822 that are connected in series and have a common gate terminal, a MOSFET 823 composing a current mirror circuit together with the MOSFET 822, and a DepMOSFET 824 series connected to the MOSFET 823. Controlling the gate of the DepMOSFET 824 with the reference voltage Vref, the level shift circuit 532 generates and delivers a voltage that is a level-shifted voltage from the reference voltage Vref to a predetermined level of voltage.

The self shut down circuit 533 comprises: a bias circuit composed of a DepMOSFET 831 and a MOSFET 832 connected in series and having a common gate terminal, a MOSFET 833 composing a current mirror circuit together with the MOSFET 832, a MOSFET 834 connected in series to the MOSFET 833, and a capacitor 835. The MOSFET 834 is ON/OFF controlled with a self shut down signal SD generated by a means such as a timer circuit or a temperature detecting circuit (that are not shown in the figure). The MOSFET 834 is in an ON state in normal operation and in an OFF state in abnormal conditions. Setting the ON resistance of the MOSFET 834 being sufficiently smaller than the ON resistance of the MOSFET 833, the self shutdown circuit 533 delivers a voltage of level-shifted reference voltage Vref as it is in the case of normal operation, and in the abnormal conditions, decreases gradually the output voltage discharging the charges on the capacitor 835 by operating the MOSFET 833.

The level shift circuit 534 includes a bias circuit composed of a DepMOSFET 841 and a MOSFET 842 connected in series with a common gate terminal, a MOSFET 843 composing a current mirror circuit together with the MOSFET 842, and a DepMOSFET 844 connected in series to the MOSFET 843. The level shift circuit 534 controls the gate of the DepMOSFET 844 with the sense voltage Vsns detected by converting to a voltage value from a current value proportional to the Ic with the sense IGBT and the sense resistor 513 shown in FIG. 12. Thus, the level shift circuit 534 generates and delivers the sense voltage Vsns that has been level-shifted to a predetermined level of voltage.

The comparator 535 compares the output of the self shut down circuit 533 and the output of the level shift circuit 534 and ON/OFF controls the MOSFET 536 according to the comparison result. If the level-shifted sense voltage Vsns is lower than the level-shifted reference voltage Vref, the MOSFET 536 is in the OFF state, and if the level-shifted sense voltage Vsns is higher than the level-shifted reference voltage Vref, the MOSFET 536 is in the ON state.

Operation of the semiconductor device for ignition shown in FIG. 12 is described in the following with reference to FIGS. 14A and 14B. The FIGS. 14A and 14B show waveforms involved in the control of the current Ic, in which FIG. 14A shows the case in which self shut down is conducted after the collector current Ic has reached the limiting current value Ilim, and FIG. 14B shows the case in which self shut down is conducted without the IC reaching the Ilim. Although the reference voltage Vref and the sense voltage Vsns are level-shifted by the level-shift circuits 532 and 534, the remarks on these facts are omitted in the following description.

Referring to FIG. 14A, when an ON signal, for example 5V, is given from the ECU 501, the current Ic flows and the sense voltage Vsns rises. When the sense voltage Vsns reaches the reference voltage Vref at the time t1, the MOSFET 536 turns ON to decrease the gate voltage VGout of the output stage IGBT 511. After that, the control to maintain the relation Vref=Vsns is performed with the comparison circuit 535 in the period from t1 to t2. When the self shut down signal SD (indicated in FIG. 13) is given, the output of the self shut down circuit 533 gradually decreases from the reference voltage Vref, and the VGout also decreases holding the relationship Vref=Vsns in the period from t2 to t3. When the VGout reaches the threshold voltage Vth of the IGBT 511, for example 2V, the current Ic is completely shut down at the time t3.

While the output of the self shut down circuit 533 decreases to approximately zero volts according to the discharge of the capacitor 535, in order to keep the Ic in the completely shut down state, the relationship Vsns>Vref>0 needs to be held still in the period of Ic=0. The level shift circuit 534 is provided for this purpose, while the level shift circuit 532 is provided for adjusting characteristics with the sense side. After the sense voltage Vsns reaches the lower limit and remains at that value, the output voltage of the self shut down circuit 533 continues decreasing. Thus, the output voltage of the comparison circuit 535 rises abruptly and the gate voltage VGout falls abruptly.

Referring to FIG. 14B, in the case the voltage of the voltage source 504 is lowered and the current Ic does not reach the limiting current Ilim, when the self shut down signal SD is given to start self shut down operation and the condition Vref=Vsns is established, the gate voltage VGout falls abruptly at the time t4. This abrupt falling down of the gate voltage VGout generates oscillation in the current Ic and may cause erroneous ignition of the ignition plug 505.

Japanese Unexamined Patent Application Publication No. 2001-153012 (also referred to herein as "Patent Document 1"), for example, discloses a method to cope with the problem of erroneous ignition due to the Ic oscillation. The device of Patent Document 1 includes a series circuit of a voltage restraining IGBT and a jumping voltage-suppressing diode, the series circuit being connected in parallel with an output stage IGBT. When the collector voltage increases in operation of the output stage IGBT and exceeds a withstand voltage of the diode, the diode yields and an electric current flows through the voltage restraining IGBT to control the collector voltage at a constant voltage.

A device disclosed in Japanese Unexamined Patent Application Publication No. 2002-371945 (also referred to herein as "Patent Document 2") comprises a voltage monitoring circuit for monitoring collector voltage of an output stage IGBT and a control current-adjusting circuit for limiting current flowing to the gate of the output stage IGBT according to the output from the voltage monitoring circuit. When a current limiting operation for the output stage IGBT begins and the collector voltage rises, the voltage monitoring circuit starts operation and the control current adjusting circuit increases the gate voltage of the output stage IGBT, suppressing the rise up of the collector voltage.

Japanese Unexamined Patent Application Publication No. 2008-045514 (also referred to herein as "Patent Document 3") discloses a one-chip igniter having integrated components on a monolithic silicon substrate, the components including: an insulated gate bipolar transistor that performs shut off control to interrupt primary current flowing in an ignition coil according to an ignition signal delivered by an electronic control unit for an internal combustion engine to generate a high voltage at the ignition coil; a current limiting circuit that limits the primary current flowing in the ignition coil; and a circuit that performs soft shut off of the primary current when a ignition signal for a period of time longer than a predetermined time or abnormal heating is detected. The time for soft shut off is set in the rage of 17 to 135 ms so as to avoid occurrence of failure such as thermal breakdown of the chip and suppress harmful combustion such as back fire of the engine due to erroneous discharge at the plug in the process of shut off of the primary current through the ignition coil corresponding to detection of abnormality such as input of an ignition signal for a period of time longer than a predetermined time or detection of overheating of the chip.

Thus, Patent Document 3 discloses a method of setting a gradually decreasing time by providing a soft shut off circuit.

Japanese Unexamined Patent Application Publication No. 2006-037822 (also referred to herein as "Patent Document 4") discloses an igniter detecting abnormality and performing self shut down, in which a rise up output of an abnormality detecting circuit is delivered, through an integration circuit composed of a diode and a capacitor, to the gate of a MOSFET for self shut down thereby gradually decreasing the gate voltage of an IGBT of a main current switching device. This means achieves a circuit having a time constant in the order of milli-seconds with a minimum circuit size and circuit area, and provides an igniter that performs self shut down without erroneous ignition upon abnormality detection.

Thus, Patent Document 4 discloses a method of setting a gradually decreasing time for the Ic by providing an integration circuit composed of a diode and a capacitor.

The conventional ignition devices for internal combustion engines described above can have one or more of the following problems.

The conventional semiconductor device for ignition shown in FIG. 12 may generate oscillation in the collector current Ic of the output stage IGBT in an operation time of the current control circuit or in an operation time of the self shut down circuit and cause erroneous ignition of the ignition plug.

The semiconductor devices for ignition disclosed in Patent Documents 1 and 2 prepare a countermeasure against the oscillation of collector current Ic of the output stage IGBT in operation of the current control circuit. However, the documents do not mention a countermeasure against oscillation of collector current Ic of the output stage IGBT in operation of the self shut down circuit, and thus have the similar problem to the one in the conventional semiconductor device for ignition shown in FIG. 12.

Likewise, the Patent Documents 3 and 4 make no mention about any countermeasure against oscillation of collector current Ic of the output stage IGBT in operation of the self shut down circuit, and have the same problem as the one in the conventional semiconductor device for ignition shown in FIG. 12. Thus, as described above, there exists certain shortcomings in the related art.

SUMMARY OF THE INVENTION

Embodiments of the invention are directed to these and other shortcomings. Certain embodiments provide a semiconductor device with a small size avoiding erroneous ignition of the ignition plug by suppressing oscillation of collector current Ic of the output stage IGBT in operation of the current control circuit and in operation of the self shut down circuit.

To accomplish these or other effects, a first aspect of the present invention includes a semiconductor device performing a current control function including a self shut down function and comprising a self shut down circuit that shuts down main current through an output stage element in an abnormal state and has a capacitor for setting a time to gradually decrease the main current through the output stage element, the capacitor being discharged in a pulsed mode.

A second aspect of the present invention is a semiconductor device in which discharge in the pulsed mode is conducted using a pulse that is generated by a pulse generating circuit according to a signal delivered by a timer circuit.

A third aspect of the present invention is a semiconductor device including a timer circuit; a pulse generating circuit that generates the pulse according to the signal delivered by the timer circuit; a switching circuit that is ON/OFF operated according to a signal delivered by the pulse generating circuit; a current source circuit that produces pulse current according to operation of the switching circuit; the capacitor that discharges with the pulse current produced in the current source circuit; a comparator circuit that receives a voltage across the capacitor as a reference voltage for comparison; and a switching element that pulls down a gate voltage of the output stage element according to an output signal from the comparator circuit.

A fourth aspect of the present invention includes a semiconductor device performing a current control function including a self shut down function, the semiconductor device including a first insulated gate type transistor that ON/OFF controls main current with a driving signal; a second insulated gate type transistor that is ON/OFF controlled with the driving signal and has a collector terminal common to the first insulated gate type transistor; a sense resistor that is connected in series with the second insulated gate type transistor at an emitter terminal thereof; a current control circuit that detects a voltage across the sense resistor and controls the main current flowing through the first insulated gate type transistor; and a gate control circuit that receives the driving signal and controls a first gate voltage for the first insulated gate type transistor and a second gate voltage for the second insulated gate type transistor;

wherein the current control circuit includes a timer circuit; a pulse generating circuit that generates a pulse according to a signal delivered by the timer circuit; a switching circuit that is ON/OFF operated according to a signal delivered by the pulse generating circuit; a current source circuit that produces pulse current according to operation of the switching circuit; a capacitor that discharges with the pulse current produced in the current source circuit; a comparator circuit that receives a voltage across the capacitor as a reference voltage for comparison; and an insulated gate type field effect transistor that pulls down the first gate voltage for the first insulated gate type transistor and the second gate voltage for the second insulated gate type transistor according to an output signal from the comparator circuit; and wherein the reference voltage is gradually decreased with the pulse current in self shut down operation to gradually decrease the main current flowing through the first insulated gate type transistor.

A fifth aspect of the present invention can include a semiconductor device in which the switching circuit is preferably composed of an insulated gate type field effect transistor that can be a MOSFET.

A sixth aspect of the present invention can include a semiconductor device in which the timer circuit is preferably composed of an oscillator and T flip-flops.

A seventh aspect of the present invention can include a semiconductor device in which preferably the gate control circuit sets a difference in electric potential between the first gate voltage and the second gate voltage with a level shift circuit provided in the control circuit, and the gate control circuit includes a first voltage dividing resistor circuit; a second voltage dividing resistor circuit; and a variable resistance circuit including a series-connected circuit between a potential of the driving signal and the ground potential, the series-connected circuit comprising a third voltage driving resistor circuit and a MOSFET with a gate voltage controlled by an output of the second voltage dividing resistor circuit.

In some embodiments, a semiconductor device includes a pulse generating circuit, a switching circuit, and a current source circuit and performing a current control function and a self shut down function in which pulse current is generated with the pulse generating circuit, the switching circuit and the current source circuit, and the charges on a capacitor is discharged by the pulse current in the process of self shut down. Thus, the collector current Ic of the output stage IGBT does not oscillate in operation of the current control circuit and in operation of the self shut down circuit, thereby avoiding erroneous ignition of the ignition plug. In some embodiments, the pulsed discharge can allow for a relatively small sized capacitor thereby providing a small sized semiconductor device.

BRIEF DESCRIPTION OF THE DRAWINGS

FIGS. 14A and 14B show operation waveforms of the semiconductor device for ignition shown in FIG. 12, wherein FIG. 14A shows waveforms in the case the collector current Ic reaches a limiting current value Ilim, and FIG. 14B shows waveforms in the case the collector current Ic does not reach a limiting current value Ilim.

DETAILED DESCRIPTION

Described below, with reference to the accompanying drawings, are certain embodiments of the present invention.

First Embodiment

Figure 1:
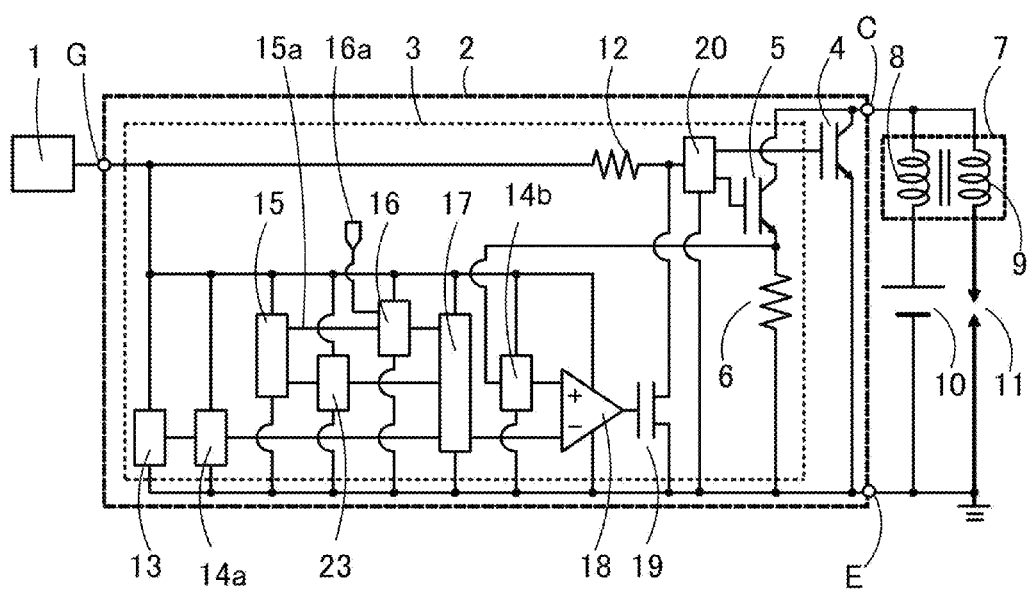
FIG. 1 shows a construction of a semiconductor device according to a first embodiment of the invention.

FIG. 1 shows a construction of a portion of a semiconductor device according to a first embodiment of the present invention. This semiconductor device is a semiconductor device for ignition performing a current control function and a self shut down function, although the invention can also be directed to other uses. In the following description, MOSFET is abbreviated to "MOS."

This semiconductor device comprises an ECU 1, an ignition IC 2, an ignition coil 7, a voltage source 10, and an ignition plug 11.

The ignition IC 2 includes an output stage IGBT 4 for ON/OFF control of the primary current through the ignition coil 7 and a current control circuit 3 for control the primary current of the ignition coil 7. The ignition IC 2 has three terminals of a collector terminal or a C-terminal connecting to the ignition coil 7, an emitter terminal or an E-terminal connecting to GND, and a gate terminal or a G terminal connecting to the ECU 1.

The current control circuit 3, driven by the voltage between the G terminal and the E terminal, comprises: a sense IGBT 5, a sense resistor 6, a gate resistor 12, a reference voltage source 13, a level shift circuit 14, a timer circuit 15, a self shut down signal source 16, a self shut down circuit 17, a comparator circuit of an operational amplifier 18, a MOS 19, a gate control circuit 20, and a pulse generating circuit 23.

Figure 2:
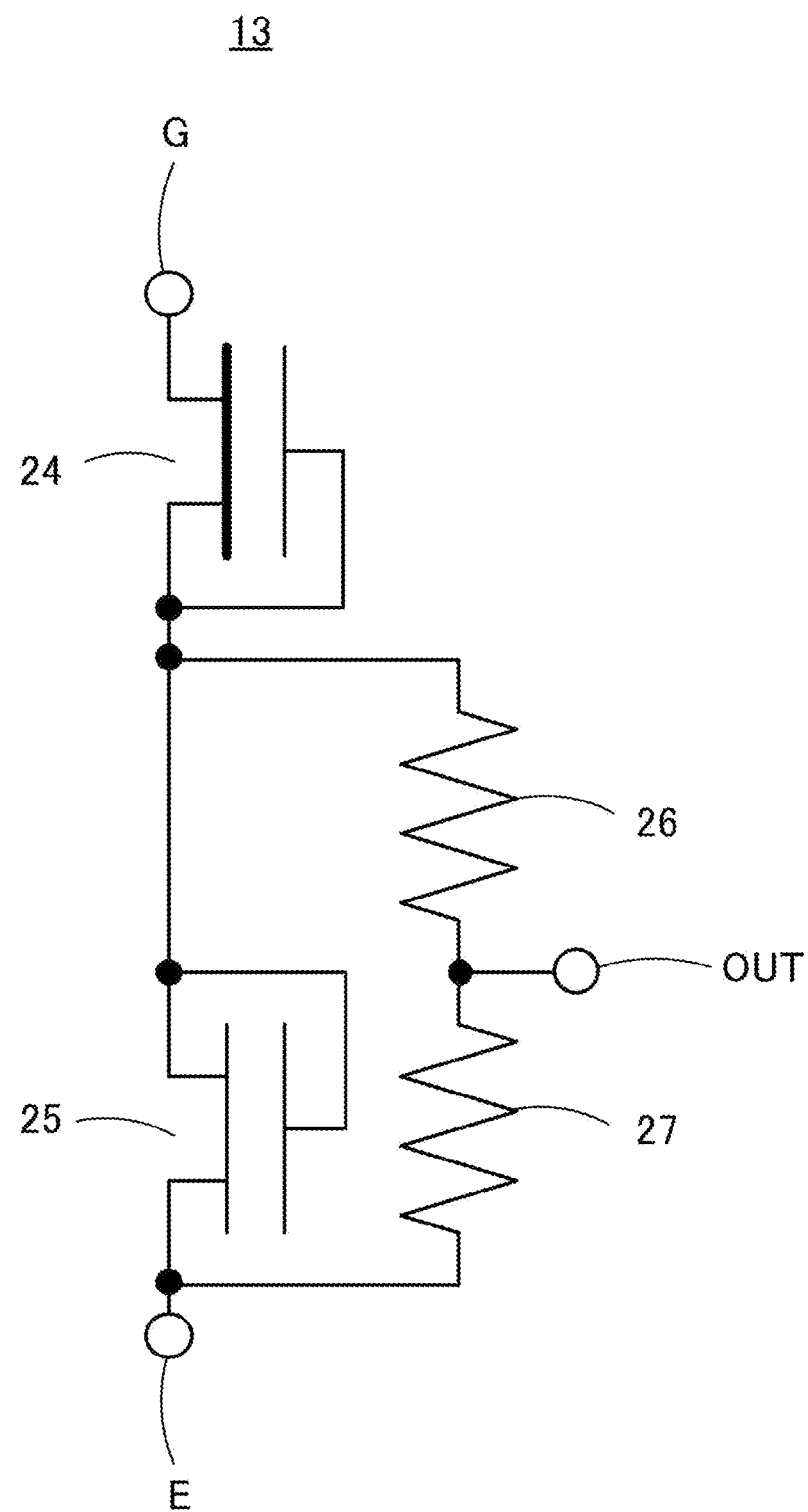
FIG. 2 is a circuit diagram of an example, according to certain embodiments, of a reference voltage source 13.

FIG. 2 is a circuit diagram showing an example of the reference voltage source 13. The reference voltage source 13 generates a reference voltage Vref dividing a voltage generated in a bias circuit with a voltage dividing circuit consisting of a resistor 26 and a resistor 27, the bias circuit being composed of a series-connected circuit, with a common gate terminal, of a DepMOSFET (or simply DepMOS) 24 and a MOS 25. The setting of this reference voltage Vref controls a rated current of the Ic.

Figure 3:
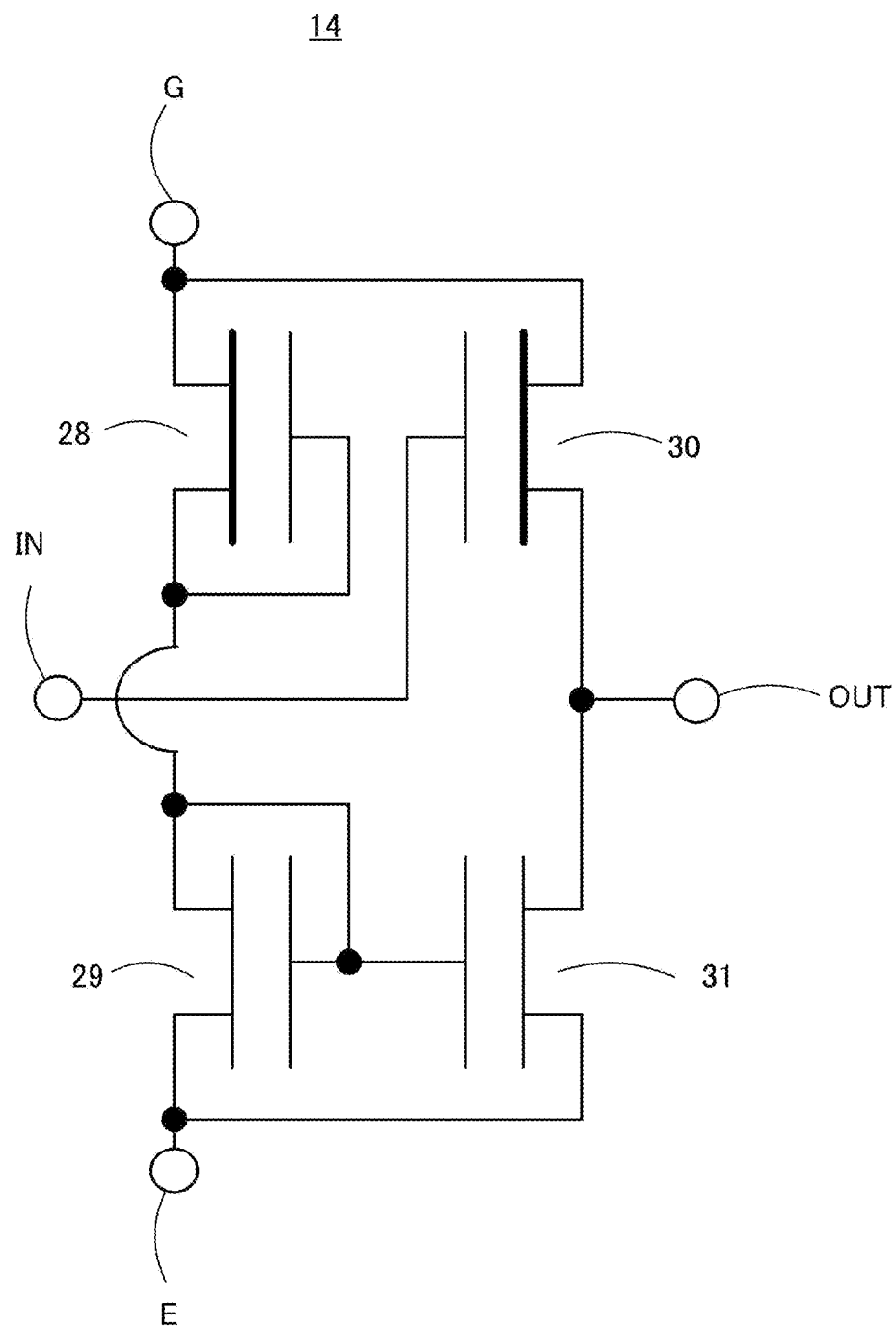
FIG. 3 is a circuit diagram of an example, according to certain embodiments, of a level shift circuit 14.

FIG. 3 is a circuit diagram showing an example of the level shift circuit 14a or 14b, the two having the same circuit construction as shown in FIG. 3. The level shift circuit 14a and 14b each comprises: a bias circuit of a DepMOS 28 and a MOS 29 that are series connected with a common gate terminal, a MOS 31 that composes a current mirror circuit together with the MOS 29, and a DepMOS 30 that is connected in series to the MOS 31. The level shift circuit 14a or 14b controls the gate voltage of the DepMOS 30 with an input signal of the reference voltage Vref or a sense voltage Vsns given to the input terminal IN and generates and delivers an output signal of the reference voltage Vref or the sense voltage Vsns that is level-shifted to a predetermined magnitude of voltage from an output terminal OUT. The sense voltage Vsns is given to the operational amplifier 18 through the level shift circuit 14b.

Figure 4:
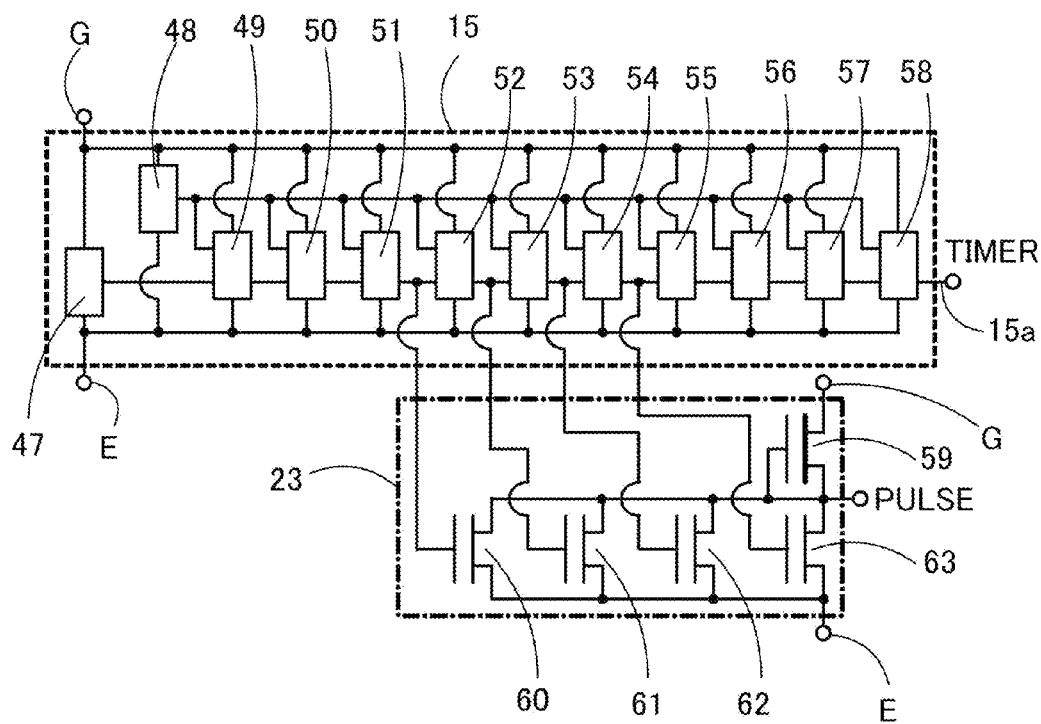
FIG. 4 is a circuit diagram showing an example, according to certain embodiments, of a timer circuit 15 and an example of a pulse generating circuit 23.

FIG. 4 is a circuit diagram showing examples of the timer circuit 15 and the pulse generating circuit 23. The timer circuit 15, driven by the voltage between the G-terminal and the E-terminal, comprises an oscillator 47, a reset circuit 48, and T flip-flops (hereinafter abbreviated to TFFs) 49 through 58. The timer circuit 15, on receiving an ON signal at the G-terminal, starts oscillation at the oscillator 47, for example, at a period of 19.6 μs and a duty factor of 50%, and at the same time, a reset circuit 48 delivers a reset signal with a time period of 10 μs, for example, to reset the TFFs 49 through 58 and turn the output OFF. Since the TFF delivers a signal with a two times the period of the input signal after stop of the reset signal, the output signal from the TIMER terminal of the timer circuit 15, which has ten stages of TFFs, has a period of 1,024 times that of the oscillator 47.

Figure 9:
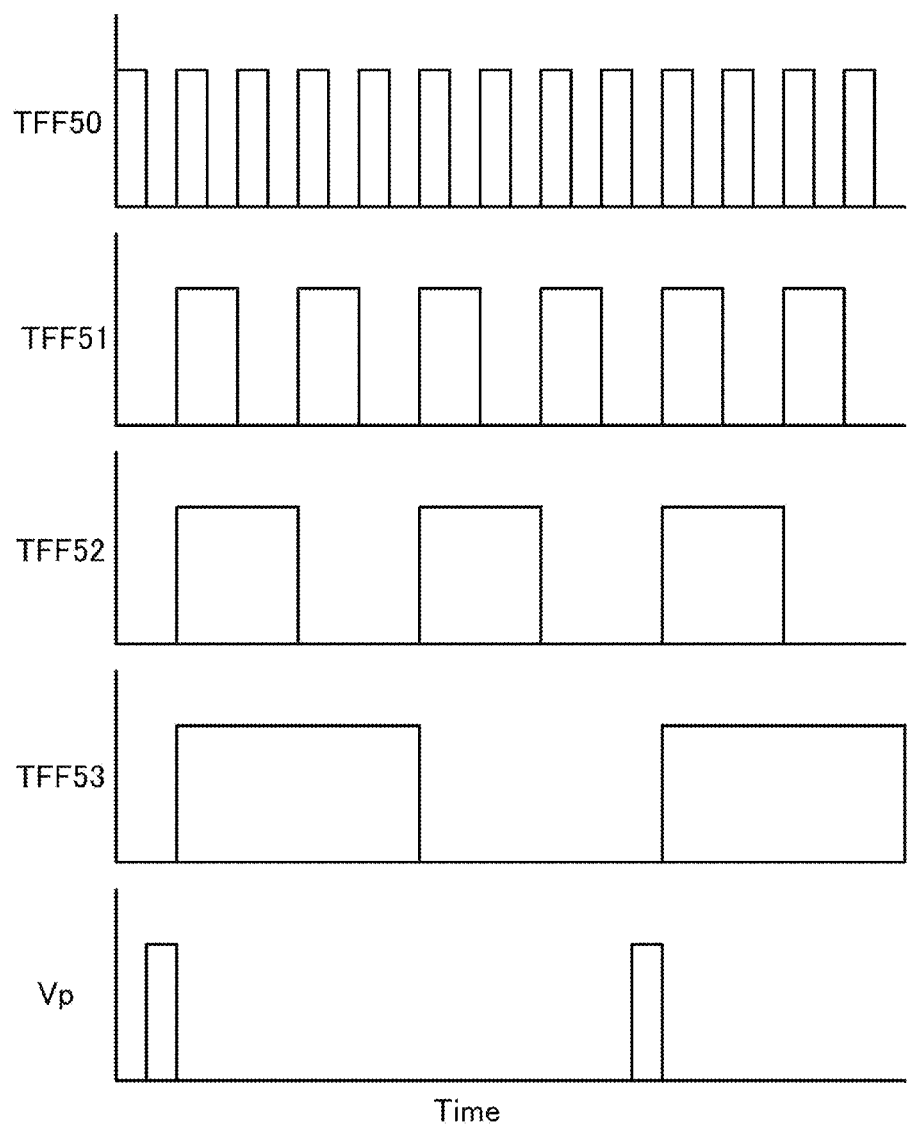
FIG. 9 shows a time chart in the process of pulse generation, according to certain embodiments.

The pulse generating circuit 23, driven by the voltage between the G-terminal and the E-terminal, comprises a DepMOS 59 and MOSs 60 through 63. The gate terminals of the MOS 60 through 63 receive the output signals of the TFFs 51 through 54. Only when all the signals are in the OFF state, an ON signal is delivered at the PULSE terminal. FIG. 9 is a time chart of the output signals of the TFFs 51 through 54 and the pulse signal at the PULSE terminal. In the case of the period of the signal of the oscillator 47 is 19.6 μs and a duty factor of 50%, for example, the pulse signal has a period of 627 μs and a duty factor of 12.5%. The arbitrary period and the duty factor of the pulse signal can be determined by correspondingly selecting a connection position of the gate terminals and the number of MOSs.

Figure 5:
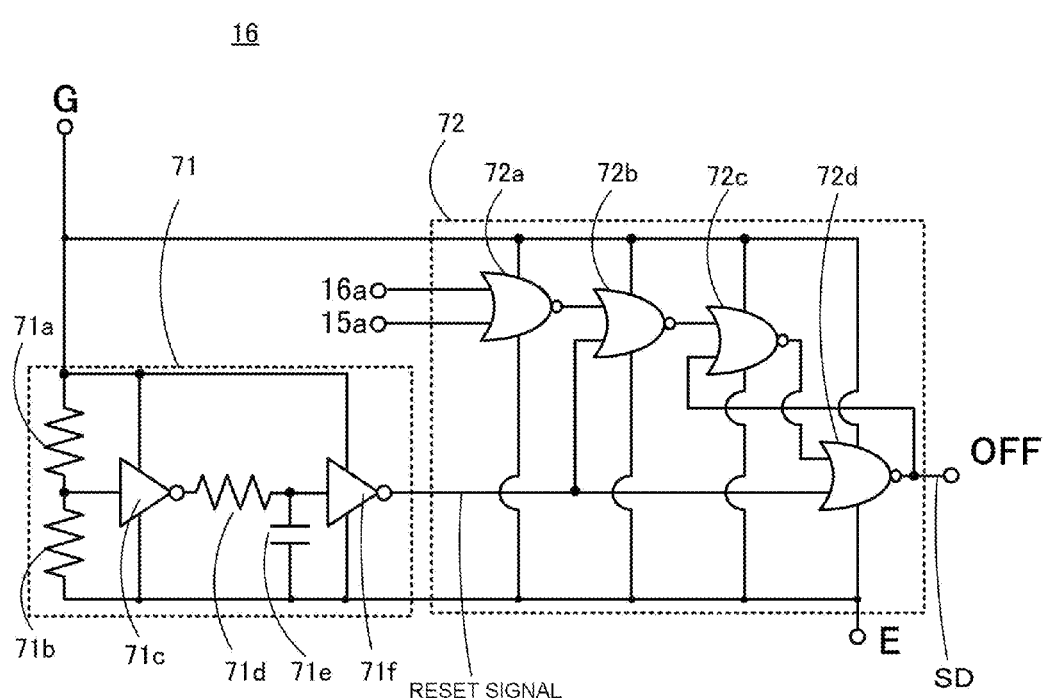
FIG. 5 is a circuit diagram of an example of a self shut down signal source 16.

FIG. 5 is a circuit diagram showing an example of the self shut down signal source 16, which is composed of a reset circuit 71 and a latch circuit 72. The reset circuit 71 comprises: resistors 71a, 71b, and 71d, inverters 71c and 71f, and a capacitor 71e. The latch circuit 72 is composed of NOR circuits 72a, 72b, 72c, and 72d. The reset signal for the latch circuit 72 is the output signal of the reset circuit 71. An input signal to the self shut down signal source 16 is the signal given to the NOR circuit 72a, which is either one of an overheat signal 16a or a timer signal 15a. Upon receiving a overheat signal 16a or a timer signal 15a, the self shut down signal source 16 delivers a self shut down signal SD from the OFF terminal, the signal SD is given to the self shut down circuit 17 to start a self shut down operation.

Figure 6:
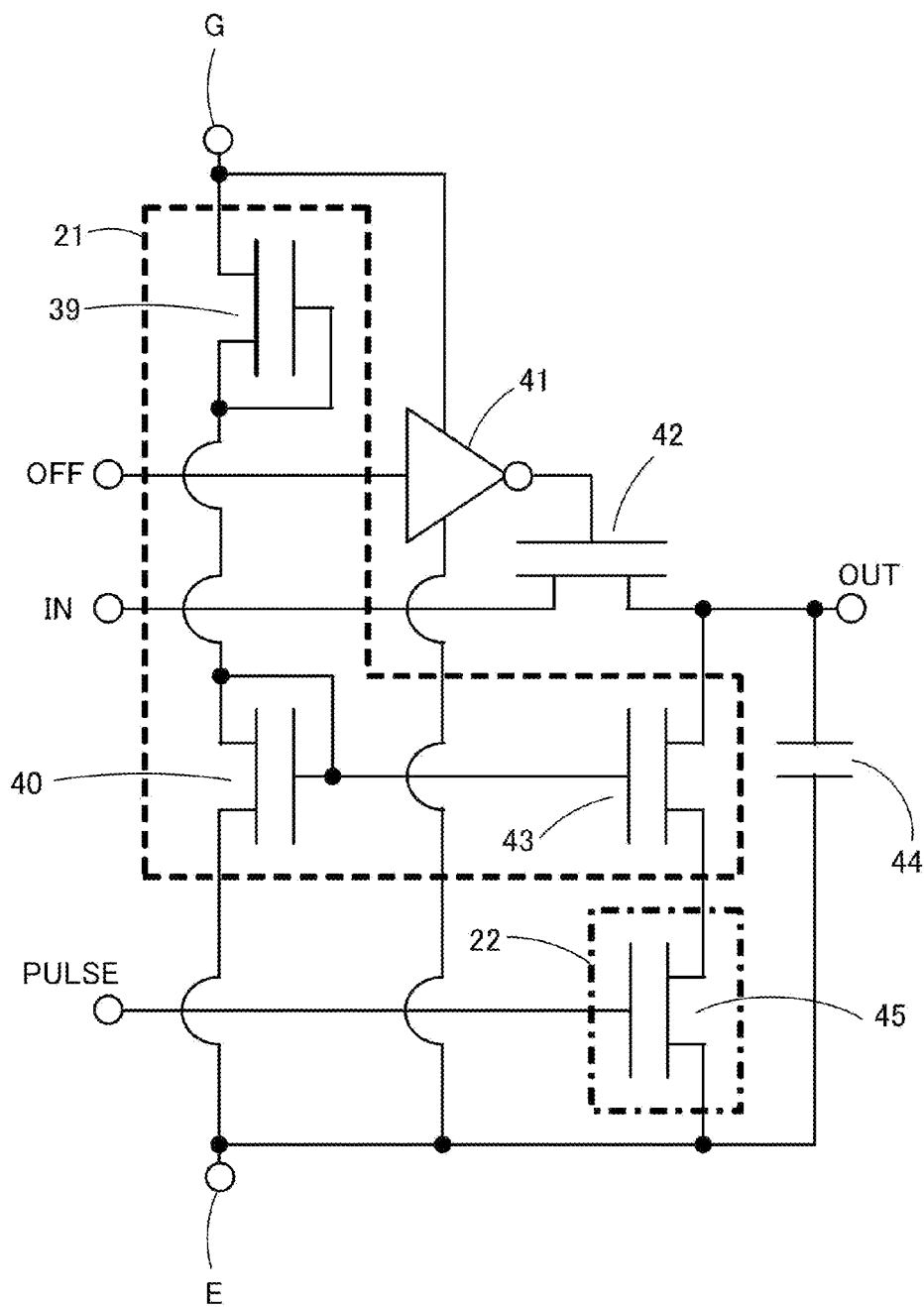
FIG. 6 is a circuit diagram of an example, according to certain embodiments, of a self shut down circuit 17.

FIG. 6 is a circuit diagram showing an example of the self shut down circuit 17. The self shut down circuit 17, driven by a voltage between the G terminal and the E terminal, comprises: a current source circuit 21, which is a current mirror circuit, a switching circuit 22, an inverter 41, a MOS 42, and a capacitor 44. The switching circuit 22 is connected to the source terminal of a MOS 43 at one end of the switching circuit 22 and to the E terminal at the other end and the ON/OFF of the switching circuit 22 is controlled with the pulse signal from the pulse generating circuit 23. The switching circuit 22 is composed of a semiconductor switching circuit, for example, a MOS 45. A current from the current source circuit 21 flows through the switching circuit 22 only in the period of an ON state of the pulse signal PULSE. The switching circuit 22 can be connected between the positive terminal of the capacitor 44 and the drain terminal of the MOS 43.

Figure 7:
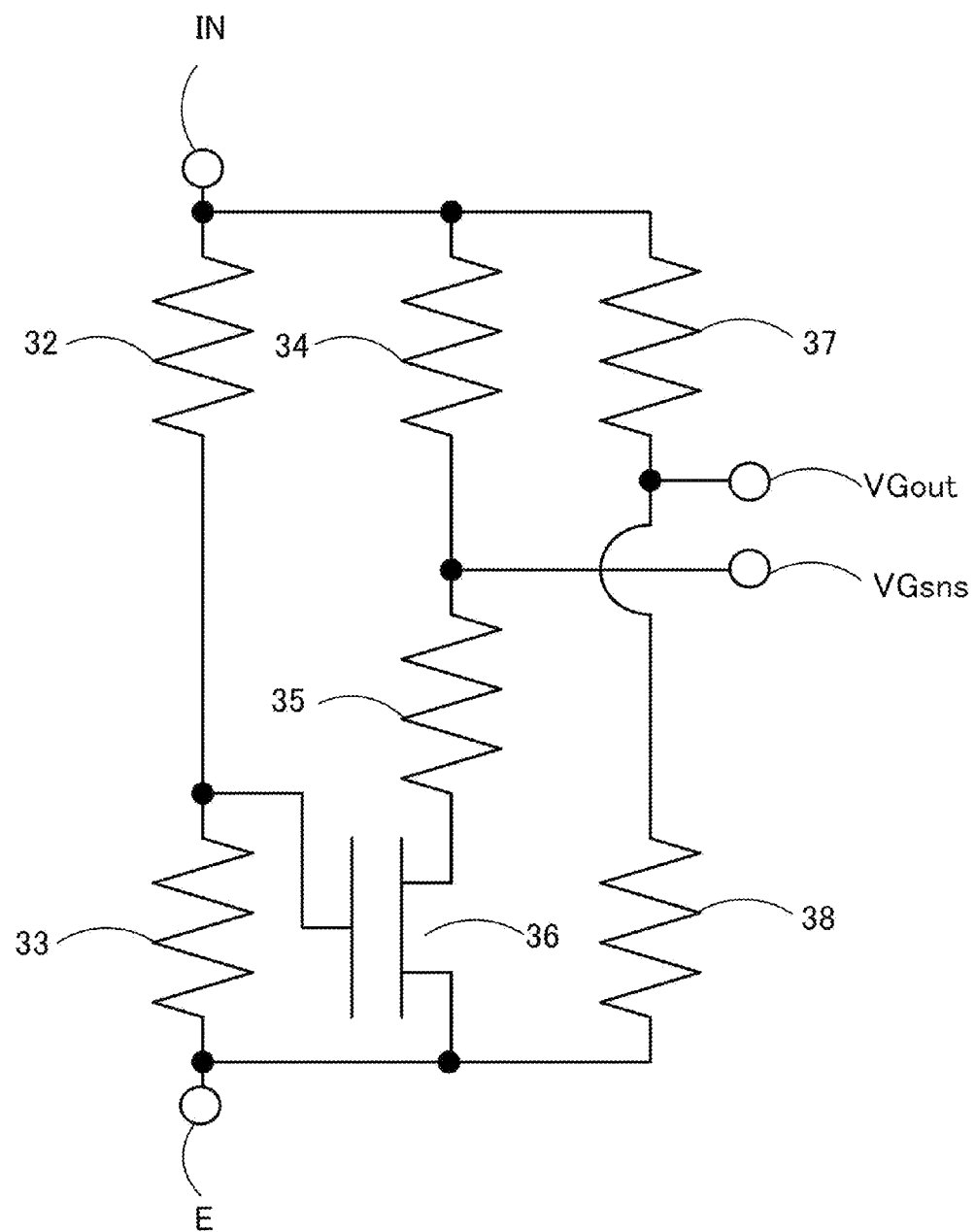
FIG. 7 is a circuit diagram of an example, according to certain embodiments, of a gate control circuit 20.

FIG. 7 is a circuit diagram showing an example of the gate control circuit 20. The gate control circuit 20 is driven by the voltage at the input terminal IN with respect to the potential at the E terminal. The voltage at the terminal IN is determined by the resistance of the gate resistor 12 connected to the G terminal indicated in FIG. 1 and the ON/OFF state of the MOS 19 also indicated in FIG. 1. The gate voltage VGout of the output stage IGBT 4 is controlled by the divided voltage of the voltage-dividing resistor circuit of resistor 37 and resistor 38 indicated in FIG. 7. The gate control circuit 20 is provided with a variable resistance circuit composed of a MOS 36 and resistors 34 and 35, the MOS 36 being driven by the divided voltage with the resistor 32 and resistor 33 given to the gate of the MOS 36. The gate voltage VGsns of the sense IGBT 5 is controlled by changing divided voltage with the resistor 34 and the resistor 35 by controlling the ON resistance of the MOS 36.

The gate control circuit 20 includes a level shift circuit composed of the resistor 32, the resistor 33, the resistor 34, the resistor 35, and the MOS 36 so that a potential difference is set between the gate voltage VGout for the output stage IGBT 4 and the gate voltage VGsns for the sense IGBT 5. Thus, the collector current Ic of the output stage IGBT 4 is prevented from occurrence of oscillation. More specifically, at the moment the gate voltage VGout of the output stage IGBT 4 reaches the threshold voltage Vth and the IGBT 4 turns OFF, the gate voltage VGsns of the sense IGBT 5 is set to be larger than the gate voltage VGout, which is equal to the Vth, of the output stage IGBT 4. Thus, the sense IGBT 5 is still in the ON state even though the output stage IGBT 4 turns OFF. Therefore, the current through the ignition coil 7 does not drop abruptly and the erroneous ignition of the plug 11 is avoided.

Then, operation of the semiconductor device shown in FIG. 1 is described in the following. The ECU 1 delivers a signal to control ON and OFF of the output stage IGBT 4 of the ignition IC 2 to the G terminal of the ignition IC 2. A voltage of 5 V given to the G terminal, for example, turns ON the output stage IGBT 4 of the ignition IC 2; and a voltage of zero volts given to the G terminal turns OFF the output stage IGBT 4 of the ignition IC 2.

On receiving an ON signal from the ECU 1 to the G terminal, the output stage IGBT 4 of the ignition IC 2 turns ON and collector current Ic begins to run from the voltage source 10 through the primary coil 8 of the ignition coil 7 to the C terminal of ignition IC 2. The Ic increases with a rate dI/dt that is determined by the inductance of the primary coil 8 and the voltage applied to the primary coil 8 until the Ic reaches a certain current value, for example 20 A, controlled by the current control circuit 3 and remains at that current value.

On receiving an OFF signal from the ECU 1 to the G terminal, the output stage IGBT 4 of the ignition IC 2 turns OFF and collector current Ic decreases rapidly. This rapid change of the Ic increases the voltage across the primary coil 8 abruptly. At the same time, the voltage across the secondary coil 9 also rises up to for example 30 kV, which acts on the ignition plug 11. The ignition plug 11 discharges at applied voltages higher than about 10 kV.

The ignition coil 7 and the ignition IC 2 may become into an abnormal state which would cause burning or other damages. The abnormality includes the occurrence in which the ON signal from the ECU 1 is longer than a predetermined time for example 10 ms, or the temperature of the ignition IC 2 is higher than a specified value for example 180° C. In such an abnormal case, the self shut down signal source 16 generates and delivers a self shut down signal SD based on the signal detected using a timer circuit, a temperature detecting circuit, or other means. According to the signal SD, a self shut down circuit 17 operates to shut down the Ic.

Figure 8:
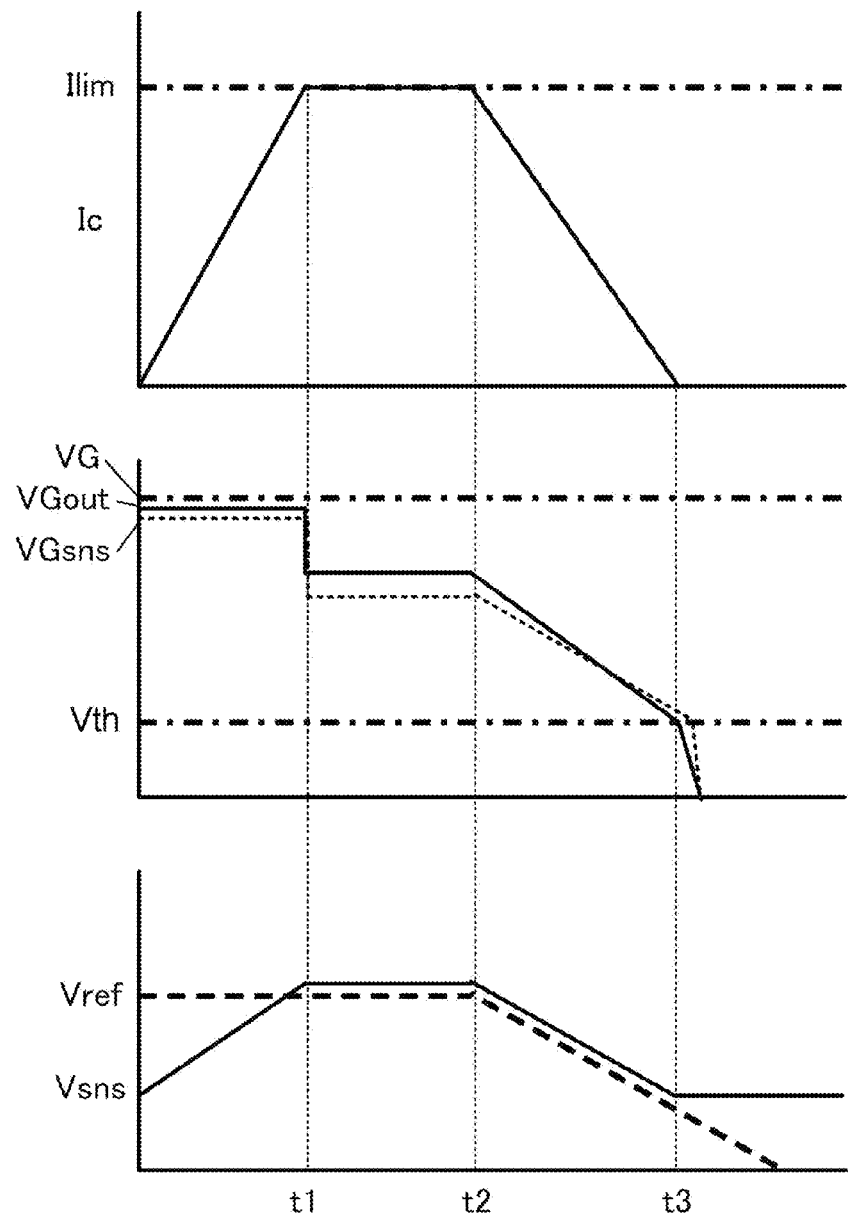
FIG. 8 shows operation waveforms of the semiconductor device shown in FIG. 1.

Then the operational waveforms in FIG. 8 are described. FIG. 8 illustrates self shut down operation of the collector current Ic through the output stage IGBT 4 in which the Ic reaches a limiting current value Ilim. Input of an ON signal at 5 V, for example, from the ECU 1 increases a sense voltage Vsns, which is a voltage lifted up from a source sense voltage Vs by the level shift circuit 14b. When the sense voltage Vsns reaches a reference voltage Vref, which is a voltage lifted up from a source reference voltage Vr of the reference voltage source 13 by the level shift circuit 14a at the time t1, the MOS 19 turns ON to decrease the gate voltage VGout of the output stage IGBT 4. After that, the operational amplifier 18 performs control to keep the relationship Vref=Vsns during the period from t1 to t2. When a self shut down signal SD indicated in FIG. 5 is delivered from the self shut down signal source 16, the self shut down circuit 17 decreases gradually the reference voltage Vref, and the VGout also decreases keeping the relationship Vref=Vsns during the period from t2 to t3. When the VGout reaches a threshold voltage Vth, for example 2V, of the IGBT 4, the Ic is completely shut down at the time t3.

The level shift circuit 14b is provided to maintain the inequality Vsns>Vref>0 even if the Ic is zero.

As shown in FIG. 1 and FIG. 6, the pulse generating circuit 23 and the switching circuit 22 are provided to discharge the charges accumulated on the capacitor 44 in the self shut down circuit 17 through the MOS 43 and the MOS 45 in a pulsed mode. This construction of the embodiment elongates the discharging time eight times longer, in the case of a duty factor of 12.5%, than a circuit construction without the MOS 45, the circuit construction discharging the charges on the capacitor 44 in a DC mode. In other words, if the discharging time is not changed or the gradual discharging speed dI/dt is unchanged, the capacity of the capacitor 44 can be reduced to ⅛. Thus, the area for forming the capacitor 44 can be reduced to ⅛. Therefore, a semiconductor device can be down-sized while preventing the ignition plug 11 from erroneous ignition and burning.

Figure 10:
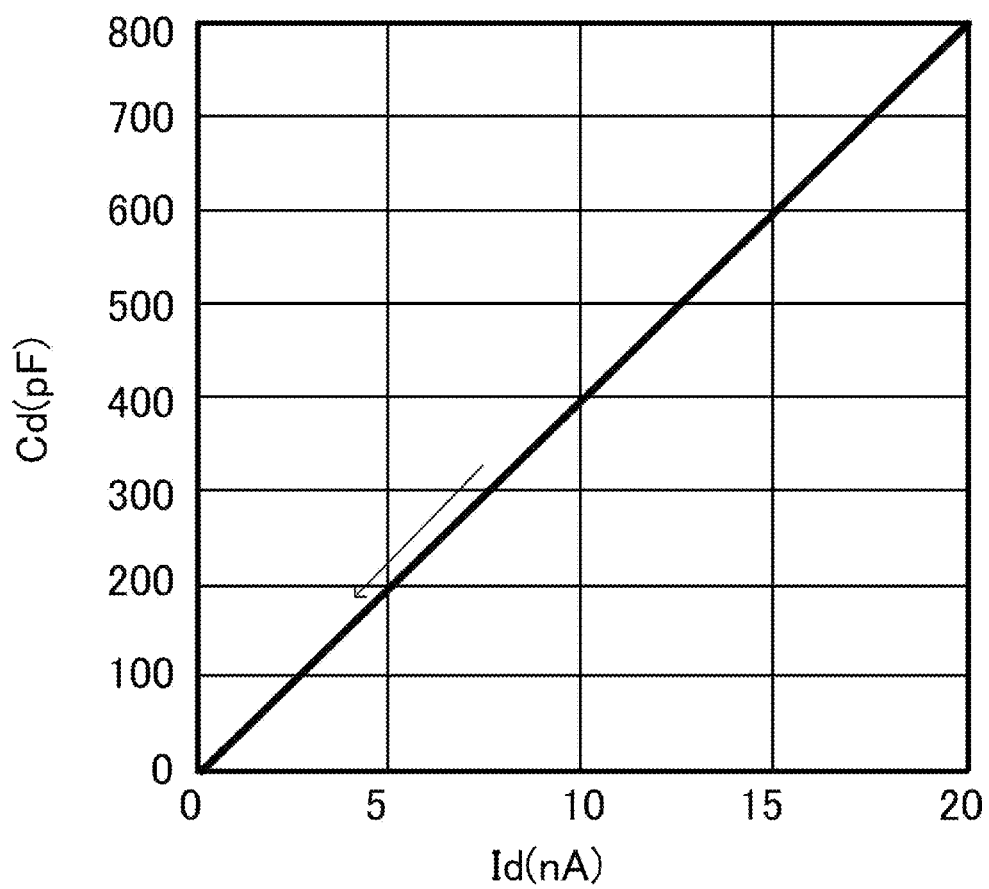
FIG. 10 shows relationship between a capacity of a capacitor 44 and discharging current Id, according to certain embodiments.

FIG. 10 shows a relationship between the capacity of the capacitor 44 and discharge current Id. The figure shows the relationship between the discharge current Id through the MOS 43 in the self shut down circuit 17 and the capacity Cd of the capacitor 44 under the conditions of: a setting value of current control Ilim=20 A, a reference voltage at the start of self shut down Vr=0.5 V, and the gradual decreasing speed of the Ic dI/dt=−1 A/ms. The discharge current Id is an averaged current.

Since the charges on the capacitor 44 are discharged in a pulsed mode, the discharge current Id is reduced. As a result, the capacity of the capacitor 44 can be reduced along the straight line in FIG. 10 toward smaller capacity region as indicated by the arrow, minimizing the capacitor 44. If the capacity Cd of the capacitor 44 is unchanged, the output current Id from the current source circuit 21 (in FIG. 6) is allowed to increase, preventing the ignition plug 11 from erroneous ignition and burning with high accuracy.

Figure 14:
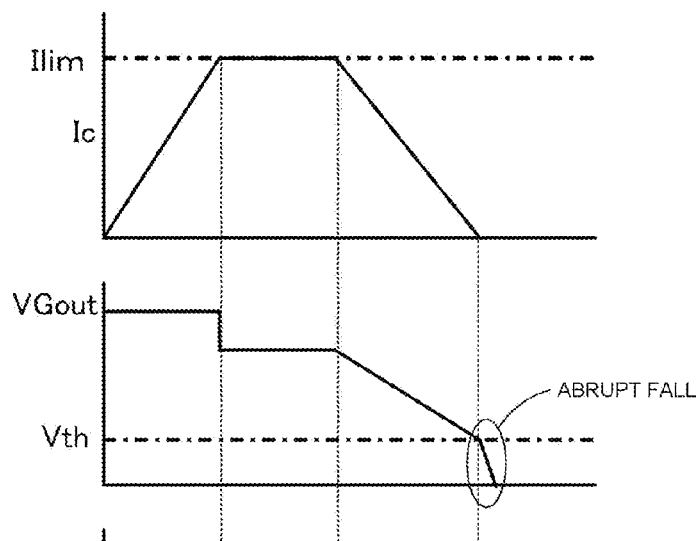
Figure 14:
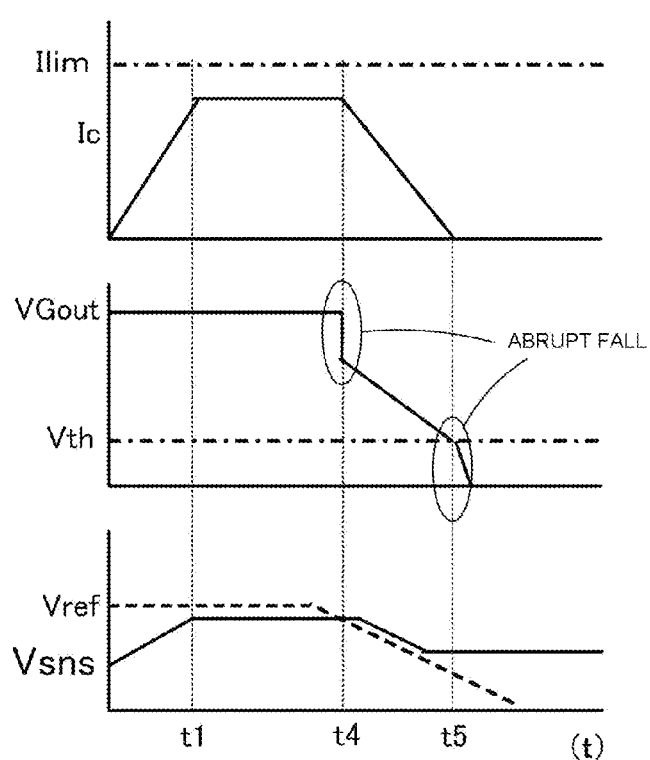

The oscillation in the current Ic due to the abrupt drop of VGout as shown in FIG. 14 is suppressed in the semiconductor device of FIG. 1 by the function of the gate control circuit 20 and any erroneous ignition is avoided.

The IGBTs 4 and 5 can be replaced by power MOSFETs or bipolar transistors.

Second Embodiment

Figure 11:
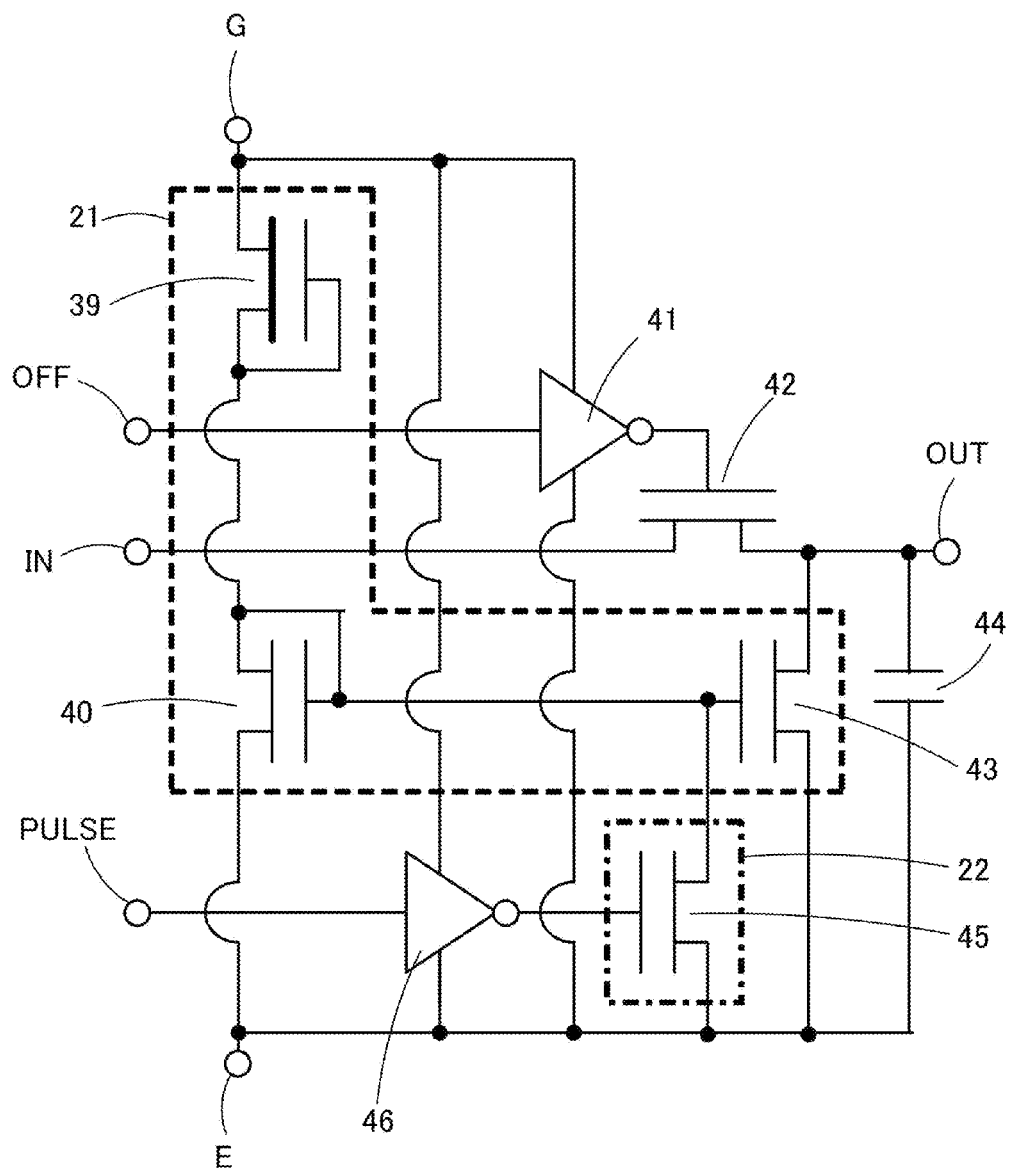
FIG. 11 shows a construction of a part of a semiconductor device according to a second embodiment of the present invention.
Figure 12:
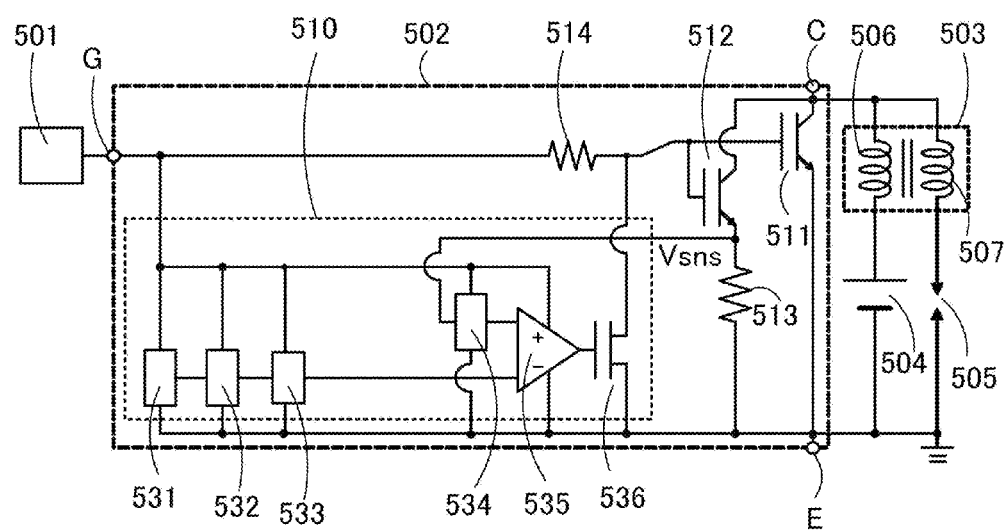
FIG. 12 shows a construction of a part of a semiconductor device according to a conventional technology.
Figure 13:
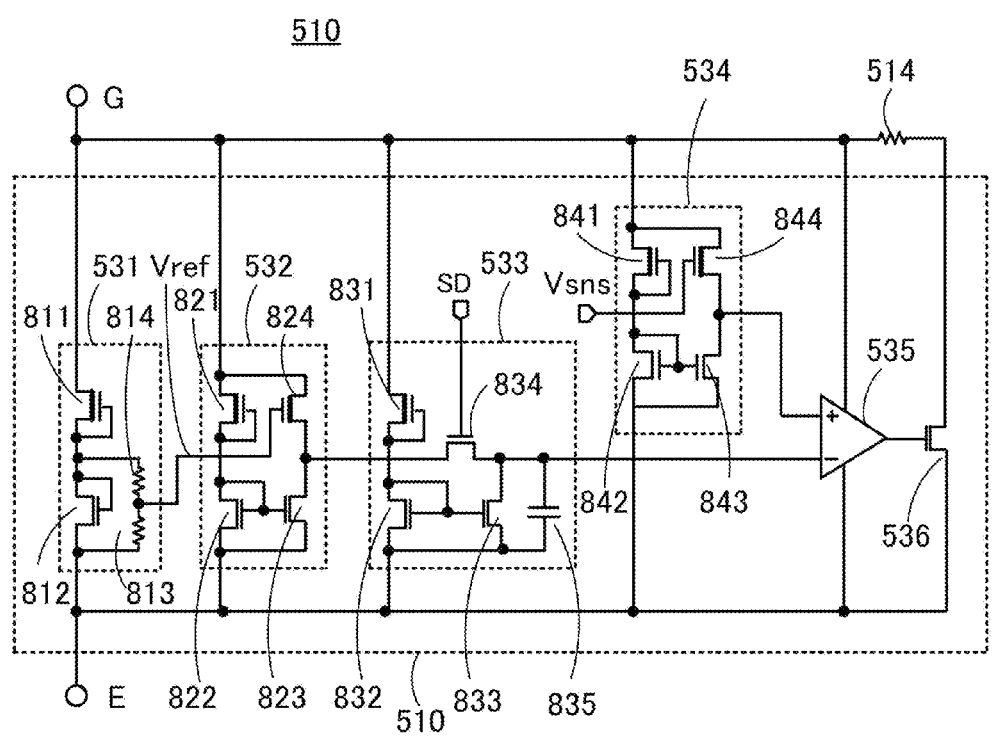
FIG. 13 is a circuit diagram of an example of the current control circuit 510, according to a conventional technology.

FIG. 11 shows an example of construction of a semiconductor device according to a second embodiment of the present invention. The figure illustrates solely the circuit construction of the self shut down circuit 17 composing the semiconductor device. Circuit construction other than the self shut down circuit 17 in the Second Embodiment is generally the same as the one in the First Embodiment.

In the self shut down circuit 17 of FIG. 11, one end of the switching circuit 22 is connected to the gate terminal of the MOS 43 and the other end is connected to the E terminal. The pulse signal inverted in the inverter 46 controls ON/OFF of the switching circuit 22. In the ON state of the switching circuit 22, the gate terminal of the MOS 43 is pulled down to interrupt the output current of the current source circuit 21. Discharging operation of the charges on the capacitor 44 in a pulsed mode in the process of self shut down is conducted in the same manner as the operation in the self shut down process in the self shut down circuit 17 of FIG. 6.

The following describes advantages of the first and second embodiments of the invention. Devices of the embodiments are provided with a pulse generating circuit 23 operated with the signal of the timer circuit 15 and a switching circuit 22 ON/OFF operated with the signal of the pulse generating circuit 23 in the self shut down circuit 17, allowing discharge in a pulsed mode of the charges accumulated on the capacitor 44 composing the self shut down circuit 17. The discharge in a pulsed mode of the charges on the capacitor 44 reduces the discharge current Id and decreases the capacity Cd of the capacitor 44. Therefore, the area for forming the capacitor 44 is reduced to minimize the semiconductor device.

In operation processes of the self shut down circuit 17 and the current control circuit 3, oscillation in the collector current Ic through the output stage IGBT 4 is suppressed by the function of the gate control circuit 20.

If the capacity Cd of the capacitor 44 is maintained, the current running through the current source circuit 21 can be high and thus highly accurate. As a result, the current value of the discharge current Id from the capacitor 44 is accurate and the reference voltage Vref to the operational amplifier 18 is accurate as well. Therefore, the ignition plug 11 is surely prevented from erroneous ignition and burning.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

This application is based on, and claims priority to, Japanese Patent Application No. 2012-059668, filed on Mar. 16, 2012, the contents of which are incorporated herein by reference in their entirety.

What is claimed is:

1. A semiconductor device performing a current control function including a self shut down function, the semiconductor device comprising:
    a first insulated gate type transistor that ON/OFF controls a main current with a driving signal;
    a second insulated gate type transistor that is ON/OFF controlled with the driving signal and has a collector terminal common to the first insulated gate type transistor;
    a sense resistor that is connected in series with the second insulated gate type transistor at an emitter terminal thereof;
    a current control circuit that detects a voltage across the sense resistor and controls the main current flowing through the first insulated gate type transistor; and
    a gate control circuit that receives the driving signal and controls a first gate voltage for the first insulated gate type transistor and a second gate voltage for the second insulated gate type transistor;
wherein
    the current control circuit comprises:
        a timer circuit;
        a pulse generating circuit that generates a pulse according to a signal delivered by the timer circuit;
        a switching circuit that is ON/OFF operated according to a pulse delivered by the pulse generating circuit;
        a current source circuit that produces pulse current according to operation of the switching circuit;
        a capacitor that discharges with the pulse current produced in the current source circuit;
        a comparator circuit that receives a voltage across the capacitor as a reference voltage for comparison; and
        an insulated gate type field effect transistor that pulls down the first gate voltage for the first insulated gate type transistor and the second gate voltage for the second insulated gate type transistor according to an output signal from the comparator circuit; and
wherein
    the reference voltage is gradually decreased with the pulse current in self shut down operation to gradually decrease the main current flowing through the first insulated gate type transistor.

2. The semiconductor device according to claim 1, wherein the switching circuit includes an insulated gate type field effect transistor.

3. The semiconductor device according to claim 1, wherein the timer circuit includes an oscillator and T flip flops.

4. The semiconductor device according to claim 1, wherein,
    the gate control circuit sets a difference in electric potential between the first gate voltage and the second gate voltage with a level shift circuit provided in the control circuit, and
    the gate control circuit comprises:
        a first voltage dividing resistor circuit;
        a second voltage dividing resistor circuit; and
        a variable resistance circuit including a series-connected circuit between a potential of the driving signal and the ground potential, the series-connected circuit comprising a third voltage driving resistor circuit and a MOSFET with a gate voltage controlled by an output of the second voltage dividing resistor circuit.

* * * * *